United States Patent
Hayashi et al.

(10) Patent No.: US 9,512,996 B2
(45) Date of Patent: Dec. 6, 2016

(54) LIGHT SOURCE UNIT OF SEMICONDUCTOR-TYPE LIGHT SOURCE OF VEHICLE LIGHTING DEVICE AND VEHICLE LIGHTING DEVICE

(75) Inventors: Masateru Hayashi, Isehara (JP); Katsuaki Nakano, Isehara (JP)

(73) Assignee: ICHIKOH INDUSTRIES, LTD., Isehara-Shi (JP)

( * ) Notice: Subject to any disclaimer, the term of this patent is extended or adjusted under 35 U.S.C. 154(b) by 0 days.

(21) Appl. No.: 13/191,961

(22) Filed: Jul. 27, 2011

(65) Prior Publication Data

US 2012/0026747 A1    Feb. 2, 2012

(30) Foreign Application Priority Data

Jul. 30, 2010    (JP) .................................. 2010-172591

(51) Int. Cl.
| | | |
|---|---|---|
| H01L 33/54 | (2010.01) | |
| F21V 31/04 | (2006.01) | |
| F21S 8/10 | (2006.01) | |

(52) U.S. Cl.
CPC .............. *F21V 31/04* (2013.01); *F21S 48/212* (2013.01); *F21S 48/215* (2013.01); *H01L 33/54* (2013.01); *H01L 2924/0002* (2013.01)

(58) Field of Classification Search
CPC ...... G02B 6/4201; G02B 6/4236; H01L 33/54
USPC ......................................................... 313/512
See application file for complete search history.

(56) References Cited

U.S. PATENT DOCUMENTS

| | | | | |
|---|---|---|---|---|
| 5,177,593 | A * | 1/1993 | Abe ................................ | 257/98 |
| 5,384,471 | A * | 1/1995 | Schairer et al. ................ | 257/98 |
| 6,610,563 | B1 * | 8/2003 | Waitl et al. .................... | 438/166 |
| 6,924,514 | B2 * | 8/2005 | Suenaga ......................... | 257/98 |
| 7,517,728 | B2 * | 4/2009 | Leung et al. ................... | 438/122 |
| 7,799,586 | B2 * | 9/2010 | Leung et al. ................... | 438/28 |
| 8,071,987 | B2 * | 12/2011 | Bogner ........................... | 257/81 |
| 8,517,571 | B2 | 8/2013 | Kayanuma | |
| 2002/0039001 | A1 * | 4/2002 | Nagai et al. ................... | 313/512 |
| 2004/0159850 | A1 | 8/2004 | Takenaka | |
| 2006/0278882 | A1 * | 12/2006 | Leung et al. ................... | 257/98 |

(Continued)

FOREIGN PATENT DOCUMENTS

| | | |
|---|---|---|
| JP | 04-113466 U | 5/1992 |
| JP | 2001-008336 A | 1/2001 |

(Continued)

OTHER PUBLICATIONS

U.S. Appl. No. 13/179,962, filed Jul. 11, 2011, Hayashi et al.

(Continued)

*Primary Examiner* — Nimeshkumar Patel
*Assistant Examiner* — Christopher Raabe
(74) *Attorney, Agent, or Firm* — Foley & Lardner LLP

(57) ABSTRACT

A capacity of a sealing member is reduced to its required minimum. The present invention provides: a board 3; light emitting chips 40 to 44; a control element; wiring elements 51 to 56, 61 to 65, and 610 to 650; a bank member 18; and a sealing member 180. The sealing member 180 is injected into the bank member 18, and the light emitting chips 40 to 44 and a part of the wiring elements are sealed. The present invention is capable of reducing the capacity of the sealing member 180 to its required minimum by means of the bank member 18.

4 Claims, 8 Drawing Sheets

(56) References Cited

U.S. PATENT DOCUMENTS

| | | | |
|---|---|---|---|
| 2007/0029569 A1* | 2/2007 | Andrews | 257/99 |
| 2007/0139908 A1* | 6/2007 | Tsuda | 362/84 |
| 2007/0285939 A1 | 12/2007 | Tachibana | |
| 2009/0046474 A1* | 2/2009 | Sato et al. | 362/466 |
| 2009/0273931 A1* | 11/2009 | Ito et al. | 362/267 |
| 2010/0128479 A1 | 5/2010 | Biebl et al. | |
| 2010/0157583 A1 | 6/2010 | Nakajima | |
| 2010/0220461 A1 | 9/2010 | Naijo | |
| 2010/0301361 A1* | 12/2010 | Wu | H01L 33/54 257/98 |
| 2011/0216543 A1 | 9/2011 | Kayanuma | |
| 2011/0254030 A1* | 10/2011 | Ahlisch et al. | 257/98 |

FOREIGN PATENT DOCUMENTS

| | | |
|---|---|---|
| JP | 2007-176219 A | 7/2007 |
| JP | 2008-166462 A | 7/2008 |
| JP | 2008-282575 A | 11/2008 |
| JP | 2008-305940 A | 12/2008 |
| JP | 2009-021264 A | 1/2009 |
| JP | 2009-087681 A | 4/2009 |
| JP | 2009-158872 A | 7/2009 |
| JP | 2011-141503 A | 7/2011 |

OTHER PUBLICATIONS

Extended European Search Report dated Apr. 25, 2016 as received in corresponding European Application No. 11175890.0.

Office Action dated Aug. 15, 2014, and its English equivalent, as received in corresponding Chinese Application No. 201110221978.7.

* cited by examiner

LIGHT SOURCE UNIT OF SEMICONDUCTOR-TYPE LIGHT SOURCE OF VEHICLE LIGHTING DEVICE AND VEHICLE LIGHTING DEVICE

CROSS REFERENCE TO RELATED APPLICATIONS

This application claims priority of Japanese Patent Application No. 2010-172591 filed on Jul. 30, 2010. The contents of this application are incorporated herein by reference in their entirety.

BACKGROUND OF THE INVENTION

1. Field of the Invention

The present invention relates to a light source unit of a semiconductor-type light source of a vehicle lighting device. In addition, the present invention relates to a vehicle lighting device using a semiconductor-type light source as a light source.

2. Description of the Related Art

A light source unit of such type is conventionally known (for example, Japanese Unexamined Patent Application Publication No. 2007-176219 or Japanese Unexamined Patent Application Publication No. 2009-21264). Hereinafter, conventional light source units will be described. The light source unit of Japanese Unexamined Patent Application Publication No. 2007-176219 is constructed so that: a plurality of LED chips are mounted on a board; and the plurality of LED chips are sealed with a resin, i.e., a sealing member. The light source unit of Japanese Unexamined Patent Application Publication No. 2009-21264 is constructed so that: a plurality of LED chips are provided on a base portion; and the plurality of LED chips are sealed with a resin mold portion, i.e., a sealing member.

In such a light source unit, a capacity of the sealing member needs to be reduced to its required minimum in order to improve sealing performance of the sealing member.

The present invention has been made to solve a problem that is to reduce the capacity of the sealing member to its required minimum.

SUMMARY OF THE INVENTION

A first aspect of the present invention is characterized in that: A light source unit of a semiconductor-type light source of a vehicle lighting device, comprising:

a mount member;

a plurality of light emitting chips of semiconductor-type light sources that are intensively mounted on the mount member, for radiating light from a front face and a side face other than a surface on which the light emitting chips are mounted on the mount member;

a control element that is mounted on the mount member, for controlling light emission of the light emitting chips;

a wiring element that is mounted on the mount member, for feeding power to the light emitting chips via the control element;

a bank member that is mounted on the mount member, for surrounding all of the plurality of the light emitting chips and a part of a wiring element; and an optically transmissible sealing member that is injected into the bank member, for sealing all of the plurality of the light emitting chips and a part of the wiring element.

A second aspect of the present invention is characterized in that: wherein a range of an inner circumferential face of the bank member that surrounds the sealing member is a range in which a start point at which at least a surface of the sealing member warps upward with respect to an inner circumferential surface of the bank member by means of a surface tension is coincident with or is substantially coincident with a critical point at which light that is radiated from a given point that is the shortest from the inner circumferential face of the bank member among the light emitting chips is fully reflected on an interface between the sealing member and a pneumatic air layer.

A third aspect of the present invention is characterized in that: wherein, on the mount member and the bank member, positioning portions for determining interpositions thereof are respectively provided.

A fourth aspect of the present invention is characterized in that:

wherein a part of the wiring element that is surrounded by the bank member, and is sealed with the sealing member, is comprised of a conductor and a wire line for electrically connecting the conductor and the light emitting chips to each other, and a portion at which the sealing member is to be injected into the bank member is a portion at which the wire line is not provided.

A fifth aspect of the present invention is characterized in that:

a lamp housing and a lamp lens that partition a lamp room; and a light source unit of a semiconductor-type light source of the vehicle lighting device according to claim 1 that is disposed in the lamp room.

A light source unit of a semiconductor-type light source of a vehicle lighting device, according to a first aspect of the present invention, enables a capacity (range) of injecting (molding) a sealing member to be restrained to be small. In this manner, the light source unit of the semiconductor-type light source of the vehicle lighting device, according to the first aspect of the present invention, is provided in such a manner that: it is sufficient if the capacity of the sealing member could be a capacity required to seal all of a plurality of light emitting chips and a part of wires and could be small in comparison with that of a sealing member that is provided fully on a mounting surface of a mount member (the surface on which a plurality of light emitting chips, control elements, and wiring elements are mounted in the mount member). As a result, the light source unit of the semiconductor-type light source of the vehicle lighting device, according to the first aspect of the preset invention, is provided in such a manner that: it is sufficient even if the capacity of the sealing member could be small; and therefore, occurrences of cracks with the sealing member can be restrained less frequently in comparison with those with a sealing member with its large capacity; and the sealing performance of the sealing member can be improved, and the yields of manufacture of optical units are improved, accordingly. In addition, the light source unit of the semiconductor-type light source of the vehicle lighting device, according to the first aspect of the preset invention, is provided in such a manner that: it is sufficient even if the capacity of the sealing member could be small; and therefore, manufacturing costs can be reduced, and a manufacturing time can be reduced while a curing time of the sealing member is reduced.

Moreover, the light source unit of the semiconductor-type light source of the vehicle lighting device, according to the first aspect of the preset invention, is provided in such a manner that: the plurality of light emitting chips are intensively mounted on the mount member; and therefore, light that is radiated from the plurality of light emitting chips that are intensively mounted can be effectively taken out, and it is sufficient even if the capacity of the sealing member could be small.

Still moreover, the light source unit of the semiconductor-type light source of the vehicle lighting device, according to the first aspect of the preset invention, can be provided in such a manner that: a bank member is mounted on the mount member; the sealing member is injected into the bank member; and then, all of the plurality of light emitting chips and a part of the wiring element are sealed with the sealing member to be thereby able to package a mount member (for example, a ceramic board), the plurality of light emitting chips, control elements, and wiring elements. As a result, the light source unit of the semiconductor-type light source of the vehicle lighting device, according to the first aspect of the preset invention, is capable of taking out a number of, for example, 20 mount members (for example, ceramic boards), each of which is configured to package the plurality of light emitting chips, control elements, and wiring elements; is capable of simplifying a manufacturing process; and is capable of reducing manufacturing costs in comparison with a case in which only one mount member can be taken out. Further, it is sufficient if a process for conveying the mount member (for example, the ceramic board) to a sealing member curing process in order to cure the sealing member, i.e., in the process for conveying the mount member (for example, the ceramic board) could be performed only one time by taking a number of, for example, 20 mount members (for example, ceramic boards) in all, in comparison with a case in which only one mount member can be taken out; and therefore, the manufacturing process can be simplified, and the manufacturing costs can be reduced accordingly.

Furthermore, the light source unit of the semiconductor-type light source of the vehicle lighting device, according to the first aspect of the preset invention, is provided in such a manner that: with respect to the mount member, the range that is restrained by the bank member, i.e., all of the plurality of light emitting chips and a part of the wiring element are sealed with the sealing member, whereas the other range, i.e., almost all of the control elements and wiring elements is not sealed with the sealing member; and therefore, a hear from almost all of the control elements and wiring elements can be effectively radiated, and a heat radiation effect is improved.

In addition, a light source unit of a semiconductor-type light source of a vehicle lighting device, according to a second aspect of the present invention, is provided in such a manner that a range of an inner circumferential face of a bank member that surrounds a sealing member is defined as a range in which a start point at which a surface of the sealing member warps upward with respect to the inner circumferential face of the bank member by means of a surface tension is coincident with or is substantially coincident with a critical point at which light that is radiated from a given point that is the shortest in distance from the inner circumferential face of the bank member among light emitting chips is fully reflected on an interface between the sealing member and a pneumatic air layer. As a result, the light source unit of the semiconductor-type light source of the vehicle lighting device according to the second aspect of the present invention, is provided in such a manner that: a loss of the light that is radiated from the plurality of light emitting chips, the light being taken out via the sealing member, can be restrained to its required minimum; and it is sufficient that the capacity of the sealing member could be at minimum.

Further, a light source unit of a semiconductor-type light source of a vehicle lighting device, according to a third aspect of the present invention, enables a bank member to be reliably and precisely mounted on a mount member by means of a positioning portion of the mount member and a positioning portion of the bank member, so that light from a plurality of light emitting chips that are taken out via a sealing member can be controlled to be optically distributed (can be optically controlled) with high precision (with less distortion).

Furthermore, a light source unit of a semiconductor-type light source of a vehicle lighting device, according to a fourth aspect of the present invention, is provided in such a manner that: a portion at which a sealing member is to be injected into a bank member is defined as a portion at which no wire lines are provided; and therefore, an injection stress of the sealing member hardly acts on the wire lines when the sealing member is injected into the bank member. As a result, the light source unit of the semiconductor-type light source of the vehicle lighting device, according to the fourth aspect of the present invention, enables electrical connecting portions (bonding portions) between the wire lines and a plurality of light emitting chips and conductors to be protected from wire disconnection, enabling the wire lines and the plurality of light emitting chips and conductors to be reliably electrically connected to each other.

Still furthermore, a vehicle lighting device according to a fifth aspect of the present invention is capable of achieving advantageous effects that are similar to those of the light source unit of the semiconductor-type light source of the vehicle lighting device, according to any one of the first to fourth aspects, by means for solving the problem described previously.

DESCRIPTION OF THE PREFERRED EMBODIMENTS

Hereinafter, with reference to the drawings, a detailed description will be given with respect to an exemplary embodiment of a light source unit of a semiconductor-type light source of a vehicle lighting device according to the present invention and an exemplary embodiment of the vehicle lighting device according to the present invention. It should be noted that the present invention is not limited by the exemplary embodiments. In FIG. 1, FIG. 3 to FIG. 11, a control element and a wiring element are not shown. In addition, in FIG. 3 to FIG. 5, a connecting member is not shown.

Exemplary Embodiments

Description of Configuration

Figure 1:
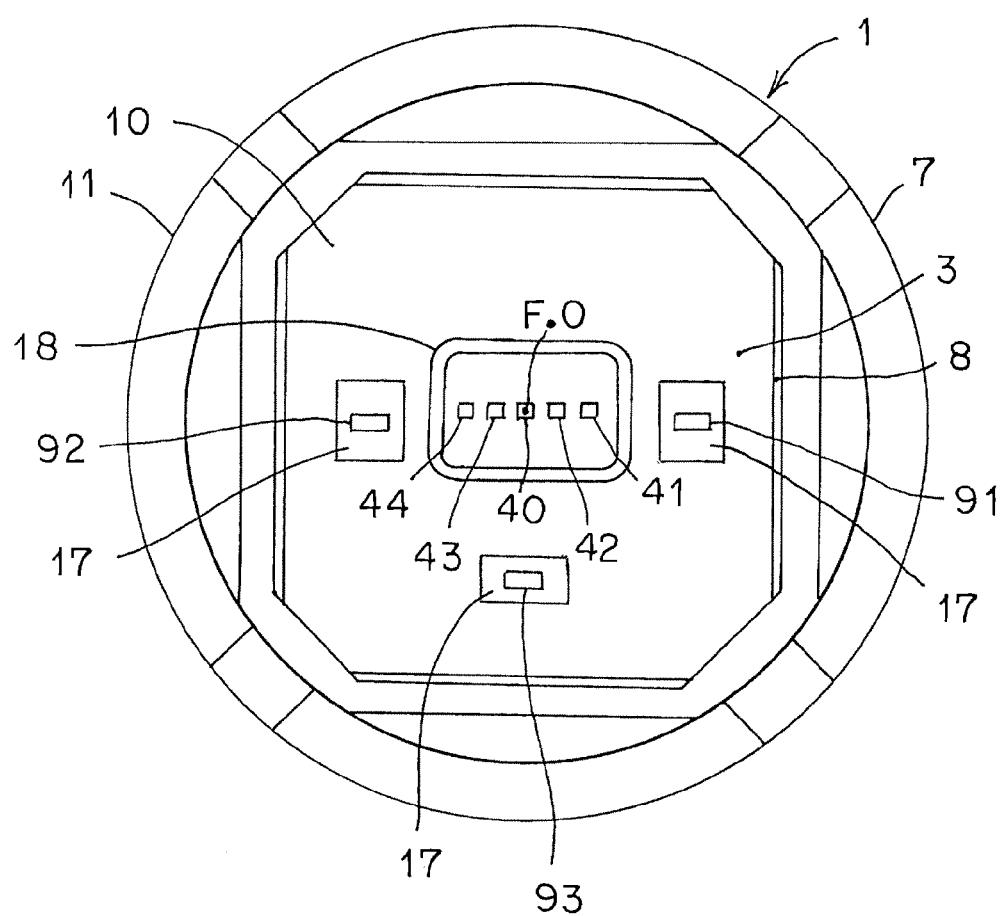
FIG. 1 is a plan view showing an exemplary embodiment of a light source unit of a semiconductor-type light source of a vehicle lighting device according to the present invention and showing a state in which a light source portion, a socket portion, and a connecting member are assembled with each other.
Figure 2:
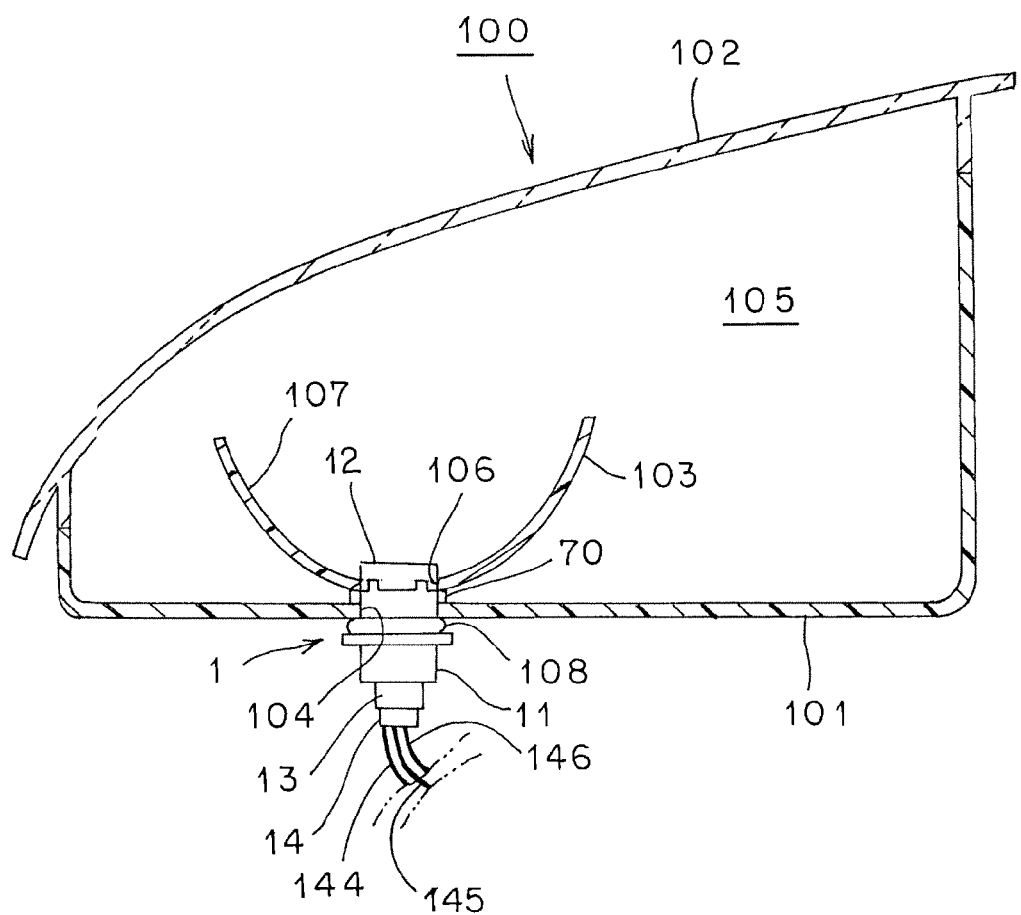
FIG. 2 is a longitudinal sectional view (a vertical sectional view) showing a state in which the light source unit is assembled with the vehicle lighting device, similarly, i.e., a longitudinal sectional view (a vertical sectional view) showing an exemplary embodiment of the vehicle lighting device according to the present invention.

Hereinafter, a description will be given with respect to a configuration of a light source unit of a semiconductor-type light source of a vehicle lighting device, in the exemplary embodiment, and the vehicle lighting device in the exemplary embodiment. In FIG. 2, reference numeral 100 designates the vehicle lighting device in the exemplary embodiment.

(Description of Vehicle Lighting Device 100)

The vehicle lighting device 100 is a single-lamp type tail/stop lamp in this example. That is, the vehicle lighting device 100 uses a tail lamp function and a stop lamp function in one combination by means of a single lamp (one lamp or one lighting device). The vehicle lighting device 100 is provided in a respective one of the left and right at a rear part of a vehicle (not shown). The vehicle lighting device 100 may be combined with another lamp function (for example, a backup lamp function or a turn signal lamp function), although not shown, to thereby constitute a rear combination lamp.

The vehicle lighting device 100, as shown in FIG. 2, is provided with: a lamp housing 101, a lamp lens 102; a reflector 103; a light source unit using a semiconductor-type light source as a light source, i.e., a light source unit 1 of the semiconductor-type light source of the vehicle lighting device, in the exemplary embodiment; and a drive circuit (not shown) of the semiconductor-type light source of the light source unit 1.

The lamp housing 101 is comprised of an optically opaque member, for example (a resin member, for example). The lamp housing 101 is formed in a hollow shape that opens at one side and that is closed at the other side. A through hole 104 is provided in a closed portion of the lamp housing 101.

The lamp lens 102 is comprised of an optically transmissible member, for example (a transparent resin member or a glass member, for example). The lamp lens 102 is formed in a hollow shape that opens at one side and that is closed at the other side. A circumferential edge part of an opening portion of the lamp lens 102 and a circumferential edge part of an opening portion of the lamp housing 101 are fixed to each other with water tightness. A lamp room 105 is partitioned by means of the lamp housing 101 and the lamp lens 102.

The reflector 103 is a light distribution control portion that controls optical distribution of light that is radiated from the light source unit 1, and has a focal point F. The reflector 103 is disposed in the lamp room 105 and is fixed to the lamp housing 101 or the like. The reflector 103 is comprised of an optically opaque member, for example (a resin member or a metal member, for example). The reflector 103 is formed in a hollow shape that opens at one side and that is closed at the other side. In a closed portion of the reflector 103, a through hole 106 is provided so as to communicate with the through hole 104 of the lamp housing 101. A reflection surface 107 is provided on an internal face of the reflector 103. Although the reflector 103 is made of a member that is independent of the lamp housing 101, this reflector may be integrated with the lamp housing. In this case, a reflector function is provided while a reflection surface is provided in a part of the lamp housing. The through hole 104 of the lamp housing 101 is formed in a circular shape. At an edge of the through hole 104, a plurality of recessed portions (not shown) and a plurality of stopper portions (not shown) are provided at substantially equal intervals.

(Description of Light Source Unit 1)

The light source unit 1, as shown in FIG. 1 to FIG. 6, is provided with: a light source portion 10; a socket portion 11; a cover portion 12 that serves as an optical part; a connecting member 17; a bank member 18; and a sealing member 180. The light source portion 10 and the cover portion 12 are mounted at one end part (an upper end part) of the socket portion 11. The light source portion 10 is covered with the cover portion 12.

The light source unit 1, as shown in FIG. 2, is mounted on the vehicle lighting device 100. That is, the socket portion 11 is removably mounted on the lamp housing 101 via a packing (an O-ring) 108. The light source portion 10 and the cover portion 12 are disposed in the lamp room 105 through the through hole 104 of the lamp housing 101 and the trough hole 106 of the reflector 103, and are disposed on the side of the reflection surface 107 of the reflector 103.

(Description of Light Source Portion 10)

The light source portion 10, as shown in FIG. 1, FIG. 3 to FIG. 12, is provided with: a board 3 as a mount member; a plurality of, in this example, five light emitting chips 40, 41, 42, 43, and 44 of the semiconductor-type light source; resistors as a control element (not shown); and diodes (not shown), and conductors (patterns or conductor patterns) 51 to 57, wire lines (gold wires, bonding wires) 61 to 65, and bonding portions (bonding pads) 610 to 650, each of which serves as a wiring element.

The board 3 is made of ceramics in this example. The board 3, as shown in FIG. 1, FIG. 3 to FIG. 6, FIG. 10, and FIG. 11, is formed in a substantially octagonal plate shape as seen from a plan (top) view. Through holes 31, 32, and 33 through which power feeding members 91, 92, and 93 of the socket portion 11 are to be inserted are respectively provided at substantial centers of three edges (a right edge, a left edge, and a lower edge) of the board 3. A flat mounting surface 34 serving as a mounting surface is provided on one face (a top face) of the board 3. A flat abutment surface 35 is provided on the other face (a bottom face) of the board 3. A high reflection surface 30 subjected to high reflection coating or high reflection vapor deposition or the like may be further provided on the mounting surface 34 of the board 3 made of ceramics that is a high reflection member.

The mounting surface 34 of the board 3 is configured to mount the five light emitting chips 40 to 44, the resistors, the diodes, the conductors 51 to 56, the wire lines 61 to 65, the bonding portion 610 to 650, and the connecting member 17 thereon (that is, these elements are provided by means of a process such as mounting, printing, burning, or vapor deposition).

The semiconductor-type light source made of the five light emitting chips 40 to 44 uses a spontaneous optical semiconductor-type light source (an LED in this exemplary embodiment) such as an LED or an EL (an organic EL). The light emitting chips 40 to 44, as shown in FIG. 1, and FIG. 3 to FIG. 5, are made of microscopic rectangular (square or rectangle-shaped) semiconductor chips (light source chips) as seen from a plan (top) view, and are made of bear chips in this example. The five light emitting chips 40 to 44 radiate light from a front face and a side face other than a surface that is mounted on the board 3. The five light emitting chips 40 to 44, as shown in FIG. 15, are disposed so as to be substantially similar to light emission caused by arc discharge from a filament of a light source bulb (an electric bulb) or an electric discharge bulb (an HID lamp) at a focal point F of the reflector 103 of an optical system and in one array in proximity of a center (a mount rotation center) O of the socket portion 11 of the light source unit 1.

The five light emitting chips 40 to 44 are light emitting chips to which a low current is to be supplied, and are divided into one light emitting chip 40 serving as a light source of a tail lamp, i.e., the light emitting chip 40 in a first group, and light emitting chips to which a mass current is to be supplied, four light emitting chips 41 to 44 serving as light sources of a stop lamp, i.e., the light emitting chips 41 to 44 in a second group. One light emitting chip 40 having the tail lamp function (the light source of the tail lamp) is disposed in a state it is sandwiched between the two light emitting chips 41 and 42 having the stop lamp function (the light sources of the stop lamp) at the right side and the two light emitting chips 43 and 44 having the stop lamp function (the light sources of the stop lamp) at the left side. The four light emitting chips 41 to 44 having the stop lamp function are connected in series in a forward direction.

A part of the resistors are made of thin-film resistors or thick-film resistors, for example. The resistors are adjustment resistors for obtaining a predetermined value of a drive current. That is, the value of the drive current that is to be supplied to the light emitting chips 40 to 44 varies depending on a distortion of Vf (voltage characteristics in forward direction) of the light emitting chips 40 to 44, and a distortion occurs in brightness (luminous flux, luminance, luminous intensity, or intensity of illumination) of the light emitting chips 40 to 44. Thus, a value of the resistors R1 to R9 is adjusted (trimmed) and then the value of the drive current that is to be supplied to the light emitting chips 40 to 44 are set to be substantially constant at a predetermined value, whereby a distortion of the brightness (luminous flux, luminance, luminous intensity, or intensity of illumination) of the light emitting chips 40 to 44 can be adjusted (absorbed). Alternatively, while brightness (luminous flux, luminance, luminous intensity, or intensity of illumination) of the light emitting chips 40 to 44 is directly monitored, the value of the resistors can be trimmed and adjusted so that the brightness (luminous flux, luminance, luminous intensity, or intensity of illumination) of the light emitting chips 40 to 44 becomes constant. The trimming is cutting part or all of the resistors R1 to R9 by means of laser beams, for example, and then, adjusting an (open) resistor value. The resistor value is increased by means of opening and trimming.

The resistors are pull-down resistors for detecting a wire disconnection of the four light emitting chips 41 to 44 in the second group, which serves as light sources of the stop lamp. The resistors are connected in series between a rear stage (a cathode side) of the diode D1 having the stop lamp function and the power feeding member 93 on a ground side.

Figure 10:
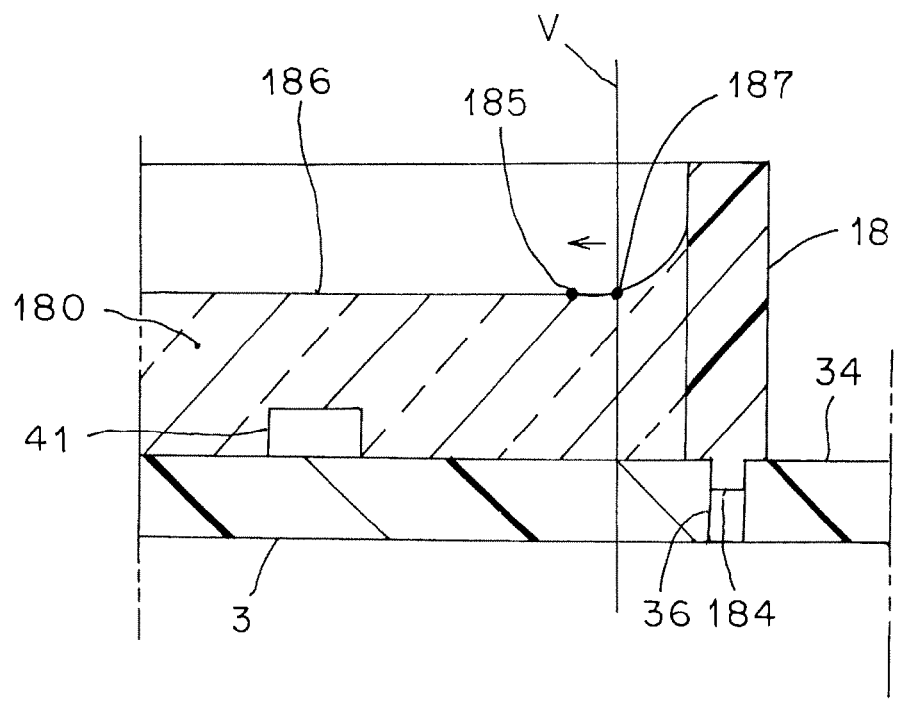
FIG. 10 is a partially enlarged sectional view showing a state in which a start point is proximal to a light emitting chip side more than the critical point, similarly.

In FIG. 10, although there are respectively disposed: the resistors that are connected in series to one light emitting chip 40 having the tail lamp function; the resistors that are connected in series to the four light emitting chips 41 to 44 having the stop lamp function; and the two resistors R11 and R12 that are connected in series to a rear stage of the diode having the stop lamp function, the number of dispositions may be varied depending on a resistor capacity and a variable width of a resistor to be adjusted. That is, the number of the resistors is not limited.

The diodes are made of diodes such as bear chip diodes or SMD diodes, for example. The diode that is connected in series to one light emitting chip 40 having the tail lamp function and the resistors and the diode that is connected in series to the four light emitting chips 41 to 44 having the stop lamp function and the resistors are diodes of an incorrect connection preventing function and a pulse noise protecting function from an opposite direction.

The conductors 51 to 56 are made of wires such as thin-film wires or thick-film wires of an electrically conductive member, for example. The conductors 51 to 56, the wire lines 61 to 65, and the bonding portions 610 to 650, each of which serves as a wiring element, are electrically fed to the light emitting chips 40 to 44 via the resistors and the diodes, each of which serves as a control element.

(Description of layout of light emitting chips 40 to 44, twelve resistors, two diodes, conductors 51 to 56, wire lines 61 to 65, and bonding portions 610 to 650, and description of drive circuit 2)

Figure 12:
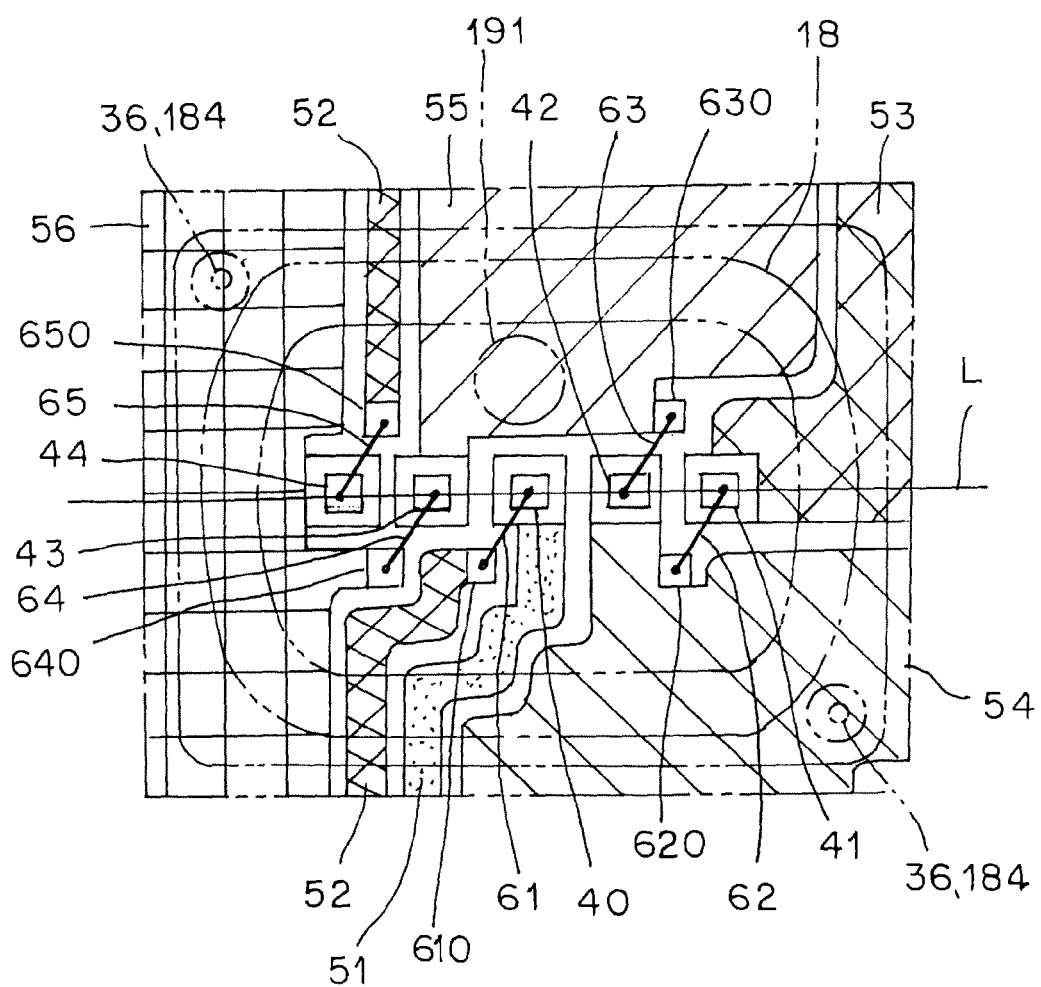
FIG. 12 is a partially enlarged sectional view showing a portion at which the sealing member is to be injected.

The five light emitting chips 40 to 44; the twelve resistors R1 to R12; the two diodes D1 and D2; the conductors 51 to 57; the wire lines 61 to 65; and the bonding portions 610 to 650 are disposed and connected to each other as shown in a partially enlarged layout view of FIG. 12.

A light emitting chip 40 having the tail lamp function, an eighth resistor, a ninth resistor, a tenth resistor, and a second diode are disposed and connected in series to a first conductor 51 of a thin-film pattern or a thick-film pattern. As the resistors, the ninth resistor and the tenth resistor are connected in parallel to each other.

A first bonding portion 610 and a fifth bonding portion 650 are disposed at a second conductor 52 of a thin-film pattern or a thick-film pattern. A first wire line 61 is connected in series to the light emitting chip 40 having the tail lamp function of the first conductor 51 and the first bonding portion 610 of the second conductor 52.

A first light emitting chip 41 having the stop lamp function, resistors, and a first diode are disposed and connected in series to a third conductor 53 of a thin-film pattern or a thick-film pattern. As the resistors, the first resistor and the second resistor, the third resistor and the fourth resistor, and the fifth resistor and the sixth resistor are respectively connected in series.

A second bonding portion 620 and a second light emitting chip 42 having the stop lamp function are disposed and connected in series to a fourth conductor 54 of a thin-film pattern and a thick-film pattern. A second wire line 62 is connected in series to the first light emitting chip 41 of the third conductor 53 and the second bonding portion 620 of the fourth conductor 54.

A third bonding portion 630 and a third light emitting chip 43 having the stop lamp function are disposed and connected in series to a fifth conductor 55 of a thin-film pattern or a thick-film pattern. A third wire line 63 is connected in series to the second light emitting chip 42 of the fourth conductor 54 and the third bonding portion 630 of the fifth conductor 55.

A fourth bonding portion 640 and a fourth light emitting chip 44 having the stop lamp function are disposed and connected in series to a sixth conductor 56 of a thin-film pattern or a thick-film pattern. A fourth wire line 64 is connected in series to the third light emitting chip 43 of the fifth conductor 55 and the fourth bonding portion 640 of the sixth conductor 56.

A fifth wire line 65 is connected in series to the fourth light emitting chip 44 of the sixth conductor 56 and the fifth bonding portion 650 of the second conductor 52.

The light source portion 10, as described previously, is provided with: the board 3 serving as a mount member; the light emitting chips 40 to 44 of a semiconductor-type light source; the resistors and the diodes, each of which serves as a control element; and the conductors 51 to 56, the wire lines 61 to 65, and the bonding portions 610 to 650, each of which serves as a wiring element.

The five light emitting chips 40 to 44; the ten resistors; the two diodes; the six conductors 51 to 56; the five wire lines 61 to 65; and the five bonding portions 610 to 650 are divided (incorporated or grouped) by the tail lamp function and the stop lamp function.

That is, the five light emitting chips are divided into: one light emitting chip 40 having the tail lamp function to which a low current is to be supplied and of which heat generation quantity is small; and four light emitting chips 41 to 44 having the stop lamp function to which a mass current is to be supplied and of which heat generation quantity is large. The six conductors are divided into: the first conductor 51 for supplying a low current to one light emitting chip 40 having the tail lamp function to which the low current is to be supplied; and the third conductor 53, the fourth conductor 54, the fifth conductor 55, and the sixth conductor 56 for supplying a mass current to the four light emitting chips 41 to 44 having the stop lamp function to which the mass current is to be supplied.

The conductors 52 to 55 for the four light emitting chips 41 to 44 having the stop lamp function to which the mass current is to be supplied are divided into four sections. The first conductor 51 for the light emitting chip 40 having the tail lamp function to which the low current is to be supplied is disposed in a state in which the conductor is sandwiched between the side of the second conductor 52 and the third conductor 53 and the side of the fourth conductor 54 and the fifth conductor 55 from among the conductors for the light emitting chips 41 to 44 having the stop lamp function to which the mass current is to be supplied and divided into four sections.

In addition, as shown in FIG. 12, the first conductor 51 for the light emitting chip 40 in a first group having the tail lamp function to which the low current is to be supplied is mounted (disposed) on the mounting surface 34, i.e., either one side (a lower side in this example) of the mounting surface 34 of the board 3 that is divided into two sections (two upper and lower sides in this example) by means of a line segment (a straight line in this example) L connecting the four light emitting chips 41 to 44 in a second group having the stop lamp function to which the mass current is to be supplied, these chips sandwiching the light emitting chip 40 having the tail lamp function to which the low current is to be supplied.

A heat generation capacity in each of the four light emitting chips 41 to 44 having the stop lamp function to which the mass current is to be supplied; the resistors; the diode, and the conductors 53 to 56 is greater in comparison with that in each of one light emitting chip 40 having the tail lamp function to which the low current is to be supplied; the resistors; the diode; and the conductor 51.

In addition, as not shown, the resistors, each of which has a large heat generation capacity having the stop lamp function to which the mass current is to be supplied, are disposed so as to be positioned in a location that is upper than that of the five light emitting chips 40 to 44 when the light source unit 1 is mounted on the vehicle lighting device 100 (refer to FIG. 2). This is because a heat generated in the resistors R1 to R7 can be released upward without affecting the five light emitting chips 40 to 44 by utilizing a property of upward heat releasing.

Among the five light emitting chips 40 to 44, one light emitting chip 40 having the tail lamp function is disposed at a center O of the board 3 and at or near a center O of a heat radiation member 8 to be described later.

(Description of Socket Portion 11)

The socket portion 11, as shown in FIG. 1 to FIG. 5, is provided with an insulation member 7, a heat radiation member 8, and three power feeding members 91, 92, and 93. The heat radiation member 8 having its thermal conductivity and electrical conductivity and the power feeding members 91 to 93 having their electrical conductivities are integrally incorporated in the insulation member 7 having its insulation property in a state in which they are insulated from each other.

The socket portion 11 is made of an integrated structure with the insulation member 7, the heat radiation member 8, and the power feeding members 91 to 93. For example, the insulation member 7, the heat radiation member 8, and the power feeding members 91 to 93 are structured to be integrally constructed by means of insert molding (integral molding). Alternatively, the insulation member 7 and the power feeding members 91 to 93 are integrally constructed by means of insert molding (integral molding), and the heat radiation member 8 is structured to be integrally mounted on the insulation member 7 and the power feeding members 91 to 93. Alternatively, the power feeding members 91 to 93 are integrally assembled with the insulation member 7, and the heat radiation member 8 is structured to be integrally mounted on the insulation member 7 and the power feeding members 91 to 93.

(Description of Insulation Member 7)

Figure 3:
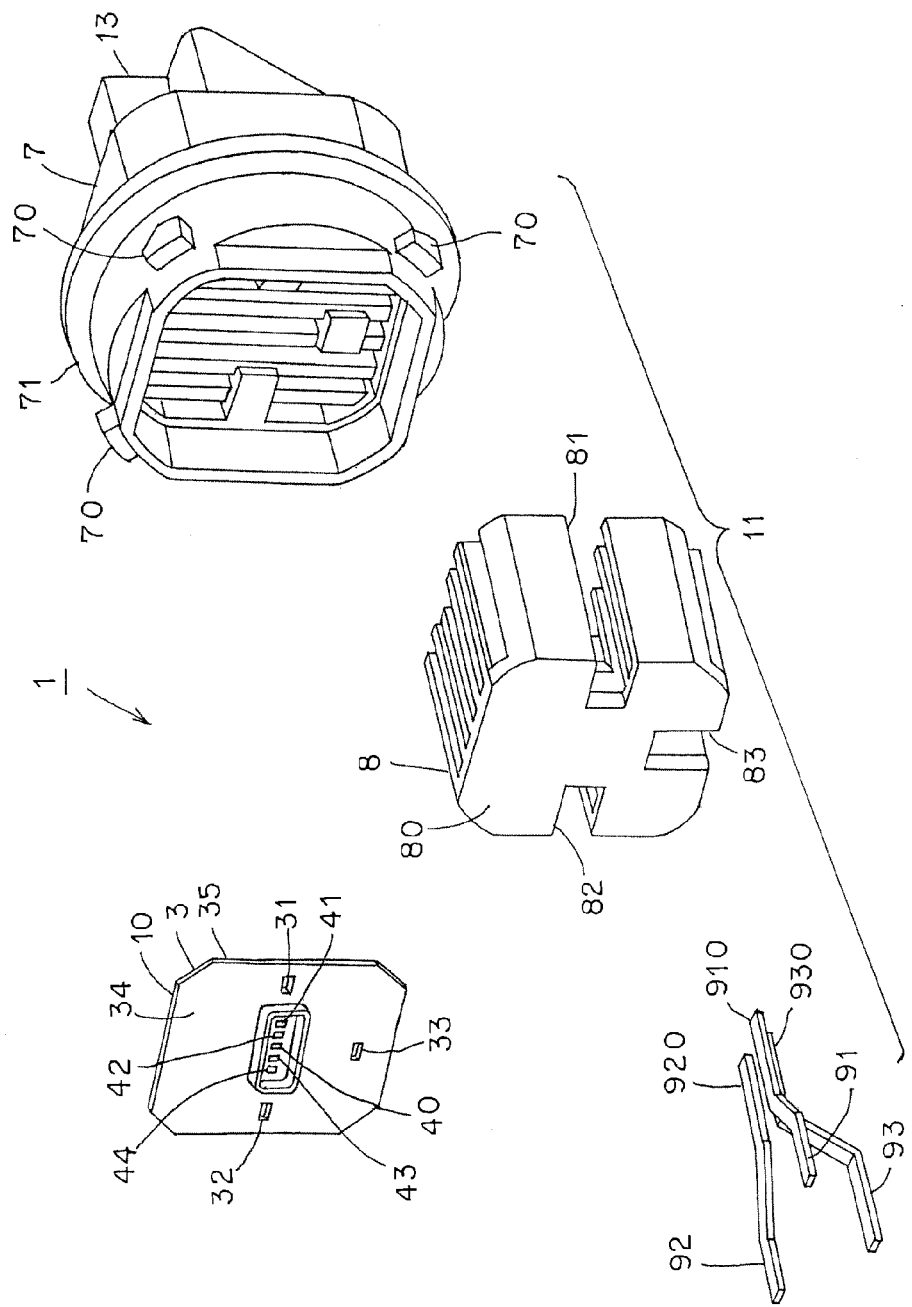
FIG. 3 is an exploded perspective view of the light source portion of the light source unit and an insulation member, a heat radiation member, and a power feeding member of the socket portion, similarly.
Figure 4:
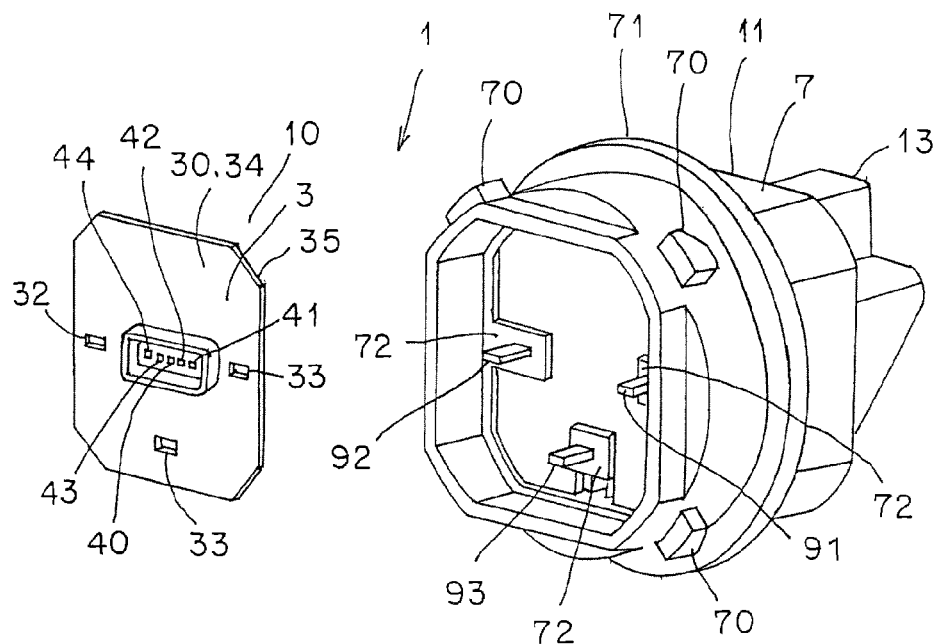
FIG. 4 is an exploded perspective view of the light source unit and the socket portion, similarly.
Figure 5:
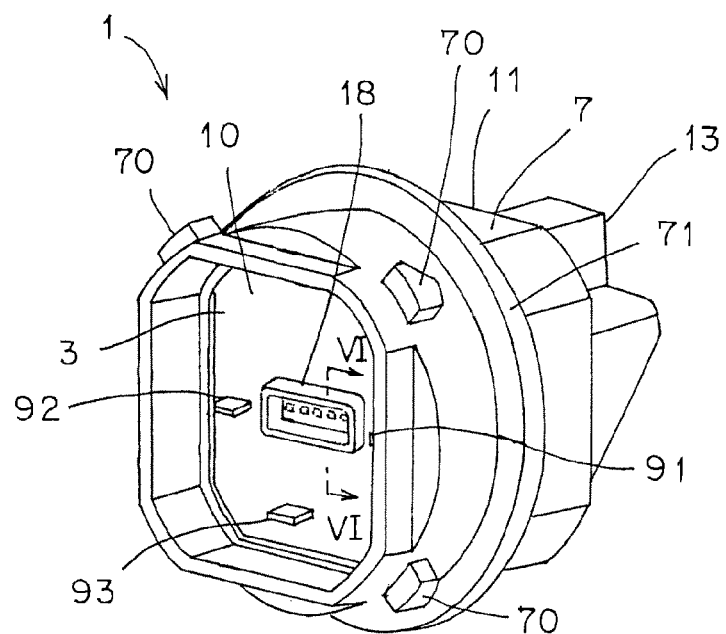
FIG. 5 is a perspective view showing a state in which the light source portion and the socket portion are assembled with each other, similarly.
Figure 6:
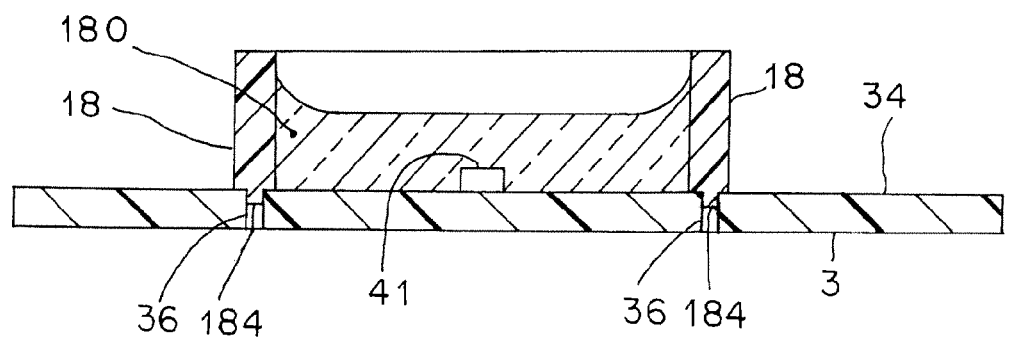
FIG. 6 is a sectional view taken along the line VI-VI in FIG. 5, similarly.
Figure 7:
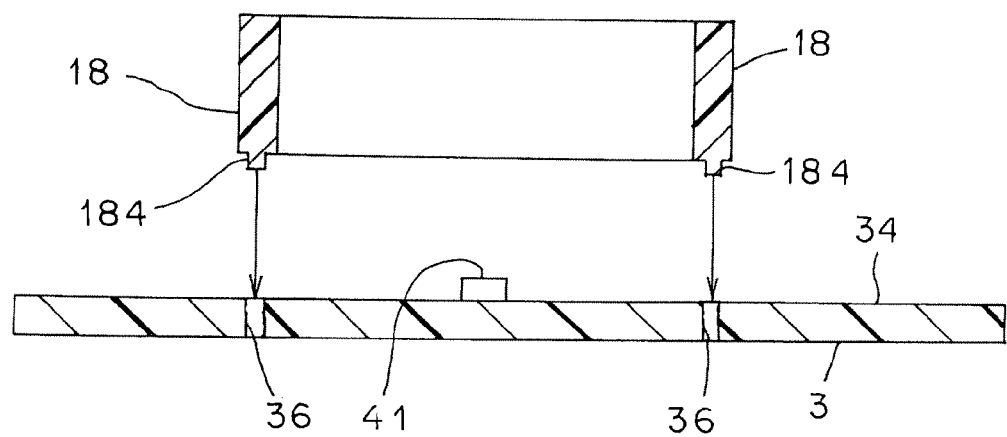
FIG. 7 is a longitudinal sectional view (a vertical sectional view) showing a state in which a bank member is mounted on a mount member via a positioning portion, similarly.

At the insulation member 7, a mount portion is provided for removably or fixedly mounting the light source unit 1 on the vehicle lighting device 100. The insulation member 7 is made of an insulation resin member, for example. The insulation member 7 is formed in a substantially cylindrical shape whose outer diameter is slightly smaller than an inner diameter of the through hole 104 of the lamp housing 101. A jaw portion 71 is integrally provided at one end part (an upper end part) of the insulation member 7. At one end part (the upper end part) of the insulation member 7, a plurality of, in this example, four mount portions 70 are integrally provided to be associated with the recessed portion of the lamp housing 101. It should be noted that only three of the mount portions 70 are shown in FIG. 3 to FIG. 5.

The mount portion 70 is intended to mount the light source unit 1 on the vehicle lighting device 100. That is, a part on the side of the cover 12 of the socket portion 11 and the mount portion 70 are inserted into the through hole 104 and the recessed portion of the lamp housing 101. In this state, the socket portion 11 is rotated axially around the center O, and the mount portion 70 is abutted against the stopper portion of the lamp housing 101. At this time point, the mount portion 70 and the jaw portion 71 sandwiches from top and bottom an edge part of the through hole 104 of the lamp housing 101 via the packing 108 (refer to FIG. 2).

As a result, the socket portion 11 of the light source unit 1, as shown in FIG. 2, is removably mounted via the packing 108 on the lamp housing 101 of the vehicle lighting device 100. At this time point, as shown in FIG. 2, a portion that is protrusive from the lamp housing 101 to the outside, of the socket portion 11, (a portion that is lower than the lamp housing 101 in FIG. 2), is greater in size than a portion that is housed in the lamp room 105, of the socket portion 11 (a portion that is upper than the lamp housing 101 in FIG. 2).

At the other end part (a lower end part) of the insulation member 7, a connector portion 13 on a light source side is integrally provided. On the connector portion 13, a connector 14 on a power supply side is mounted mechanically, removably, and electrically.

(Description of Heat Radiation Member 8)

The heat radiation member 8 is intended to radiate the heat that is generated at the light source portion 10 to the outside. The heat radiation member 8 is made of an aluminum die cast or a resin member having its thermal conductivity (also having its electrical conductivity). The heat radiation member 8 is formed in a flat shape at one end part (an upper end part) and is formed in a fin-like shape from its intermediate part to the other end part (a lower end part). An abutment surface 80 is provided on a top face of one end part of the heat radiation member 8. The abutment surface 35 of the board 3 is mutually abutted against the abutment surface 80 of the heat radiation member 8, and in that state, these abutment surfaces are adhesively bonded with each other by means of a thermally conductive medium (not shown). As a result, the light emitting chips 40 to 44 each are positioned to be associated with a portion at which a proximal portion of the center O of the heat radiation member 8 (the center O of the socket portion 11) is positioned via the board 3.

The thermally conductive medium is a thermally conductive adhesive agent, and is made of an adhesive agent such as an epoxy-based resin adhesive agent, a silicone-based resin adhesive agent, or an acryl-based resin adhesive agent, and is made of that of a type such as a liquid-like type, a fluid-like type, or a tape-like type. The thermally conductive medium may be a kind of thermally conductive grease in addition to the thermally conductive adhesive agent.

At a substantial center of each of three edges (a right edge, a left edge, and a lower edge) of the heat radiation member 8, cutouts 81, 82, and 83 are respectively provided to be associated with the through holes 31 to 33 of the board 3. The three power feeding members 91 to 93 are respectively disposed in the cutouts 81 to 83 of the heat radiation member 8 and the through holes 31 to 33 of the board 3. The insulation member 7 is interposed between the heat radiation member 8 and each of the power feeding members 91 to 93. The heat radiation member 8 comes into intimate contact with the insulation member 7. The power feeding members 91 to 93 come into intimate contact with the insulation member 7.

(Description of Power Feeding Members 91 to 93)

The power feeding members 91 to 93 are intended to feed power to the light source portion 10. The power feeding members 91 to 93 are made of electrically conductive metal members, for example. One-end parts (upper end parts) of the power feeding members 91 to 93 are formed in a divergent shape, and are respectively positioned in the cutouts 81 to 83 of the heat radiation member 8 and through holes 31 to 33 of the board 3. One-end parts of the power feeding members 91 to 93 are respectively electrically connected to the wire 6 of the light source portion 10 via the connecting member 17.

That is, as shown in FIG. 4, on one end face (an upper end face) of the insulation member 7, protrusive portions 72 that are protrusive into the cutouts 81 to 83 are integrally provided at sites corresponding to the cutouts 81 to 83 of the heat radiation member 8. One-end parts of the power feeding members 91, 92, and 93 are protrusive from the protrusive portions 72; are electrically and mechanically connected to the connecting member 17; and are respectively electrically connected to the first conductor 51, the third conductor 53, and the second conductor 52 of the board 3. In this manner, the light source portion 10 is mounted on one end part (a one-end opening portion) of the socket portion 11 that is formed in a cylindrical shape.

The other-end parts (lower end parts) of the power feeding members 91 to 93 are formed in a narrowed shape, and are disposed in the connector portion 13. The other-end parts of the power feeding members 91 to 93 constitute male terminals (male-type terminals) 910, 920, and 930.

(Description of Connector Portion 13 and Connector 14)

At the connector 14, female terminals (female-type terminals)(not shown) are provided for electrically connecting to or disconnecting from the male terminals 910 to 930 of the connector portion 13. The connector 14 is mounted on the connector portion 13, whereby the female terminals electrically connect to the male terminals 910 to 930. In addition, the connector 14 is removed from the connector portion 13, whereby electrical connection between the male terminals and the male terminals 910 to 930 is interrupted.

As shown in FIG. 2, the first female terminal and the second female terminal of the connector 14 are connected to a power source (a direct current power battery) (not shown) via harnesses 144 and 145 and a switch SW (not shown). The third female terminal of the connector 14 is earthed (grounded) via a harness 146. The connector portion 13 and the connector 14 are a connector portion and a connector of three-pin type (the three power feeding members 91 to 93, the three male terminals 910 to 930, and the three female terminals).

(Description of Switch SW)

The switch SW is a three-position changeover switch made of a movable contact point, a first fixed contact point, a second fixed contact point, a third fixed contact point, and a common fixed contact point. When the movable contact point is switched to a position of the first fixed contact point, a current (a drive current) is supplied to one light emitting chip 40 having the tail lamp function via the diode having the tail lamp function and the resistors. That is, a drive current is supplied to one light emitting chip 40 having the tail lamp function via the diode having the tail lamp function and the resistors.

When the movable contact point is switched to a position of the second fixed contact point, a current (a drive current) is supplied to the four light emitting chips 41 to 44 having the stop lamp function via the diode having the stop lamp function and the resistors. That is, a drive current is supplied to the light emitting chips 41 to 44 having the stop lamp function via the diode having the stop lamp function and the resistors.

When the movable contact point is switched to a position of the third fixed contact point, power supply to the five light emitting chips 40 to 44 is interrupted.

(Description of Cover Portion 12)

The cover portion 12 is made of an optically transmissible member. At the cover portion 12, an optical control portion (not shown) such as a prism is provided for optically controlling and emitting light from the five light emitting chips 40 to 44. The cover portion 12 is an optical part or an optical member.

The cover portion 12, as shown in FIG. 2, is mounted on one end part (a one-end opening portion) of the socket portion 11 that is formed in a cylindrical shape so as to cover the light source portion 10. The cover portion 12, together with the sealing member 180, is intended to prevent the five light emitting chips 40 to 44 from an external effect, for example, from being contacted by any other foreign matter or from adhering of dust. That is, the cover portion 12 is intended to protect the five light emitting chips 40 to 44 from a disturbance. In addition to protecting the five light emitting chips 40 to 44, the cover portion 12 is also intended to protect from a disturbance: the resistors and the diodes, each of which serves as a control element; and the conductors 51 to 56, the wire lines 61 to 65, and the bonding portions 610 to 650, each of which serves as a wiring element. A through hole (not shown) may be provided in the cover portion 12.

(Description of Connecting Member 17)

Hereinafter, the connecting member 17 will be described. The connecting member 17 is comprised of a member having its electrical conductivity, elasticity, and attributes (expandability or plasticity), for example, a member made of a material such as phosphorus bronze or brass. The connecting member 17 is intended to electrically connect the light source portion 10 and the socket portion 11 to each other.

(Description of Electrical Connection Member 17 Between Light Source Portion 10 and Socket Portion 11 by Means of Connecting Member)

First, two light source connecting portions (not shown) of the connecting member 17 are respectively engaged with two engagement holes (not shown) of the board 3 of the light source portion 10, and a heat is applied to an electrically conductive adhesive agent (not shown) that is provided around the engagement holes of the board 3. In this manner, the light source connecting portions of the connecting member 17 are respectively electrically and mechanically connected to the first conductor 51, the second conductor 52, and the third conductor 53 of the board 3 of the light source portion 10, and the board 3 of the light source portion 10 and the connecting member 17 are temporarily fixed (sub-assembled) to each other.

Next, a thermally conductive medium (not shown) is applied onto the abutment surface 80 of the heat radiation member 8 of the socket portion 11, and one-end parts of the power feeding members 91 to 93 are inserted into the through holes 31 to 33 of the board 3.

Next, the abutment surface 35 of the board 3 of the light source portion 10 is placed on the thermally conductive medium of the socket portion 11. Then, two socket connecting portions (not shown) of the connecting member 17 are securely tightened at both sides of one-end parts of the power feeding members 91 to 93. In addition, the securely tightened two socket connecting portions of the connecting member 17 and both sides of the one-end parts of the power feeding members 91 to 93 are welded by means of laser welding or the like. In this manner, the socket connecting portions of the connecting member 17 are electrically and mechanically connected to the power feeding members 91 to 93 of the socket portion 11.

In the foregoing securely tightening process and in the foregoing welding process, the board 3 is pressurized to the side of the heat radiation member 8. Under the foregoing pressurization, the thermally conductive medium is mounted and fixed. In this manner, the light source portion 10 and the socket portion 11 are electrically connected to each other by means of the connecting member 17.

(Description of Bank Member 18 and Sealing Member 180)

The bank member 18 is comprised of an insulation member, for example, a resin. The bank member 18 is formed in a mouth shape when it is seen from a plan view, and has a sufficient height more than a height of each of the light emitting chips 40 to 44; a resistor and a diode, each of which serves as a control element; the conductors 51 to 56, each of which serves as a wiring element; the wire lines 61 to 65; and the bonding portions 610 to 650. The bank member 18 is a member (a bank or a dam) for restraining a capacity (a range) of injecting (mold or molding) the sealing member 180 to be small At least two positioning protrusive portions 184, each of which serves as a positioning portion, are integrally provided on one end face (a lower end face) of the bank member 18. On the other hand, on the mounting face 34 of the board 3, at least two positioning through holes 36, each of which serves as a positioning portion, are provided in association with the positioning protrusive portions 184. The positioning protrusive portions 184 and the positioning through holes 36 are engaged with each other, whereby the bank member 18 and the board 3 are respectively positioned. The positioning through holes 36 may be positioning recessed portions with which the positioning protrusive portions 184 engage.

The bank member 18 that is positioned together with the board 3 by means of the positioning protrusive portions 184 and the positioning through holes 36 is adhesively bonded (mounted) by means of an insulation adhesive agent (not shown) onto the mounting face 34 of the board 3 on which the light emitting chips 40 to 44, the resistor, the diode, and the conductors 51 to 56 are mounted. After the bank member 18 has been adhesively bonded (mounted), the wire lines 61 to 65 are bonded and provided onto the mounting surface 34 of the board 3. After the light emitting chips 40 to 44; the resistor, the diode, and the conductors 51 to 56; the wire lines 61 to 65; and the bonding portions 610 to 650 have been mounted on the mounting surface 34 of the board 3, the bank member 18 may be adhesively bonded (mounted) onto the mounting surface 34 of the board 3.

The bank member 18, as indicated by the double-dotted chain line in FIG. 12, is intended to surround: all of the five light emitting chips 40 to 44; a part of the conductors 51 to 56 and all of the wire lines 61 to 65; and all of the bonding portions 610 to 650.

A portion 191 for injecting the sealing member 180 into the bank member 18, as indicated by the double-dotted chain line in FIG. 12, is a portion at which the wire lines 61 to 65 are not provided. A size of the injection portion 191 is the one that corresponds to two light emitting chips or two wire lines, as shown in FIG. 12, although not limited in particular.

The sealing member 180 is comprised of an optically transmissible member, for example, an epoxy resin. The sealing member 180 is injected in appropriate quantity from the injection portion 191 into the bank member 18 after the wire lines 61 to 65 have been bonded and provided. By curing the sealing member 180, all of the five light emitting chips 40 to 44; a part of the conductors 51 to 56; all of the wire lines 61 to 65; and all of the bonding portions 610 to 650 are sealed with the sealing member 180. The sealing member 180 in intended to prevent all of the five light emitting chips 40 to 44, a part of the conductors 51 to 56, all of the wire lines 61 to 65, and all of the bonding portions 610 to 650 from external influence, for example, contact of another object or from adhering of dust. That is, the sealing member 180 is intended to protect constituent elements such as the five light emitting chips 40 to 44 from a disturbance.

Figure 8:
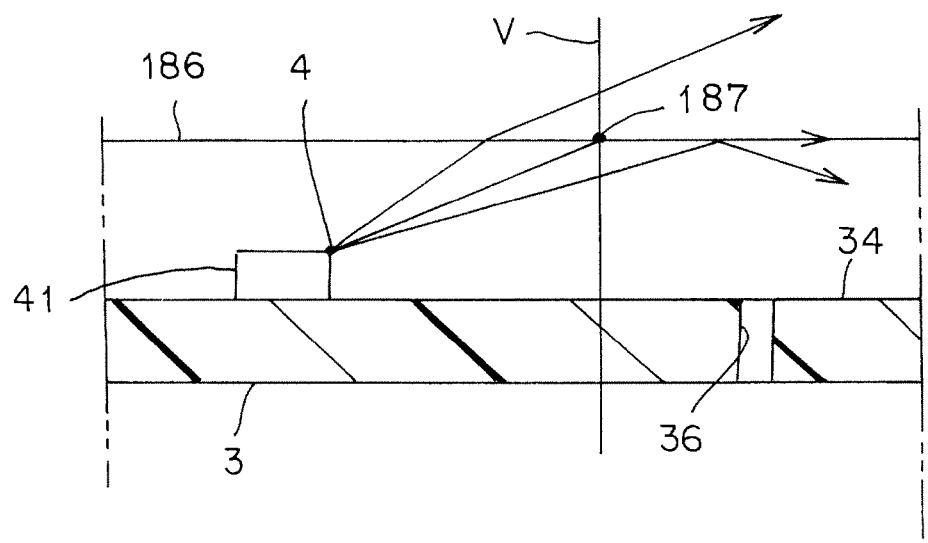
FIG. 8 is a partially enlarged sectional view showing a critical point at which light from light emitting chips is fully reflected on an interface between a sealing member and a pneumatic air layer, similarly.
Figure 9:
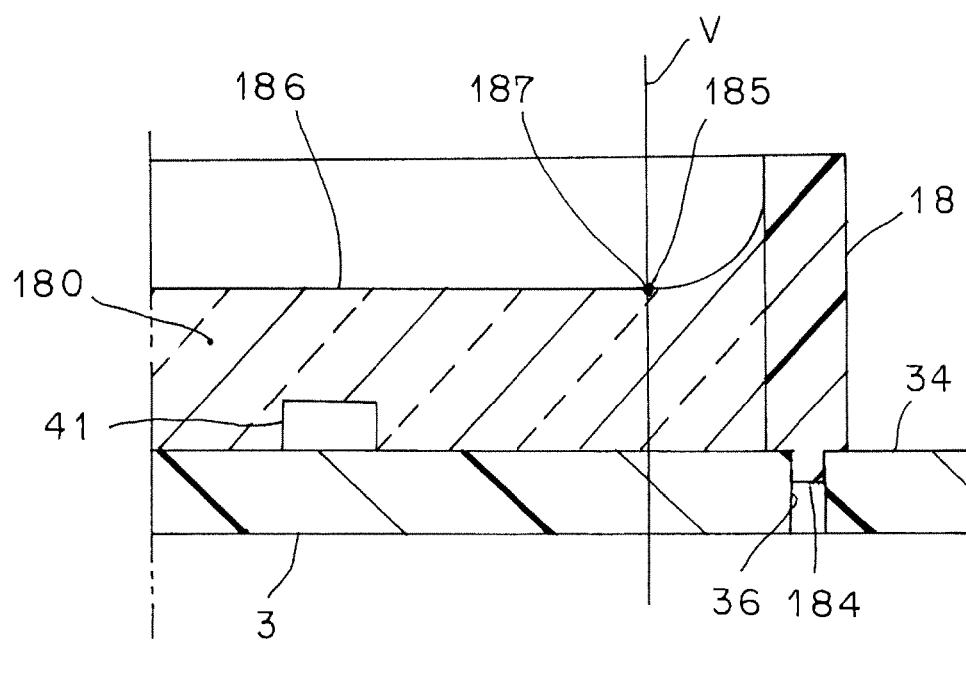
FIG. 9 is a partially enlarged sectional view showing a range of an inner circumferential face of the bank member that surrounds the sealing member, similarly.

The range of the inner circumferential face of the bank member 18 that surrounds the sealing member 180, as shown in FIG. 8 and FIG. 9, is a range in which a start point 185 at which the surface of the sealing member 180 warps upward with respect to the inner circumferential face of the bank member 18 by means of a surface tension is coincident with or is substantially coincident with a critical point 187 at which light (refer to the solid arrow in FIG. 8) that is radiated from a point 4 that is the shortest in distance from the inner circumferential face of the bank member 18 among the light emitting chips 41, (for example), is fully reflected on an interface 186 between the sealing member 180 and a pneumatic air layer. The uppercase letter "V" in FIG. 8 to FIG. 11 indicates a vertical line at the critical point 187. Here, as shown in the first exemplary embodiment, in a case where the wire lines 61 to 65 and the bonding portions 610 to 650 are mounted (packaged) on the mounting surface 34 of the board 3, when the wire lines 61 to 65 and the bonding portions 610 to 650 are mounted on the board 3, the range of the inner circumferential face of the bank member 18 may be extended so as not to become an obstacle to the mounting process. In this case, the start point 185 is proximal to the inner circumferential face side of the bank member 18 more than the critical point 187 (the vertical line V).

That is, as indicated by the solid arrow in FIG. 10, in a case where the start point 185 is proximal to the side of the light emitting chip 41 more than the critical point 187, the capacity of the sealing member 180 can be reduced; and however, among rays of the light that is radiated from the light emitting chips 41, the light that is radiated from the start point 185 to the critical point 187 cannot be effectively utilized by means of a concave curve (a concave curved face) of the sealing member 180.

Figure 11:
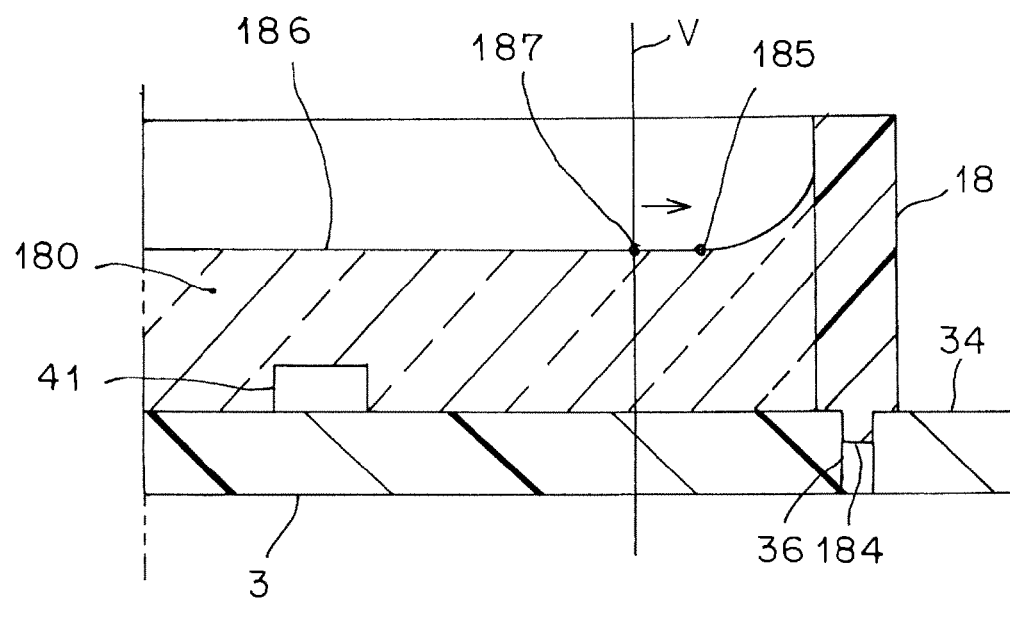
FIG. 11 is a partially enlarged sectional view showing a state in which a start point is proximal to a bank member side more than the critical point, similarly.

On the other hand, as indicated by the solid arrow in FIG. 11, in a case where the start point 185 is proximal to the side of the bank member 18 more than the critical point 187, the light that is radiated from the light emitting chip 41 can be mostly effectively utilized, whereas the capacity of the sealing member 180 increases.

From the foregoing description, it is preferable that the range of the inner circumferential face of the bank member 18 that surrounds the sealing member 180 be a range in which the start point 185 and the critical point 187 are coincident with or are substantially coincident with each other.

(Description of Functions)

The light source unit 1 of the semiconductor-type light source of the vehicle lighting device, in the exemplary embodiment, and the vehicle lighting device 100 in the exemplary embodiment (hereinafter, referred to as the light source unit 1 and the vehicle lighting device 100, in the exemplary embodiment) are made of the constituent elements as described above. Hereinafter, functions of the light source unit and the vehicle lighting device will be described.

First, a movable contact point of a switch is switched to a first fixed contact point. That, a current (a drive current) is supplied to one light emitting chip 40 having a tail lamp function through a diode and a resistor, each of which has the tail lamp function. As a result, one light emitting chip 40 having the tail lamp function emits light.

The light that is radiated from one light emitting chip 40 having the tail lamp function passes through a sealing member 180, a pneumatic air layer, and a cover portion 12 of the light source unit 1, and then, the light having passed through the sealing member is controlled to be optically distributed. A part of the light that is radiated from the light emitting chip 40 is reflected onto the side of the cover portion 12 by means of a high reflection surface 30 of the board 3. The light that is controlled to be optically distributed passes through a lamp lens 102 of the vehicle lighting device 100, the light having passed through the lamp lens is controlled to be optically distributed again, and then, the thus controlled light is emitted to the outside. In this manner, the vehicle lighting device 100 emits light distribution of the tail lamp function to the outside.

Next, the movable contact point of the switch is switched to a second fixed contact point. Then, a current (a drive current) is supplied to four light emitting chips 41 to 44, each of which has a stop lamp function, through a diode and a resistor, each of which has the stop lamp function. As a result, the four light emitting chips 41 to 44, each of which has the stop lamp function, emit light.

The light that is radiated from the four light emitting chips 41 to 44, each of which has the stop lamp function, passes through the sealing member 180, the pneumatic air layer, and the cover portion 12 of the light source unit 1, and then, is controlled to be optically distributed. A part of the light that is radiated from the light emitting chips 41 to 44 is reflected onto the side of the cover portion 12 by means of the high reflection surface 30 of the board 3. The light that is controlled to be optically distributed passes through the lamp lens 102 of the vehicle lighting device 100, the light having passed through the lamp lens is controlled to be optically distributed again, and then, the thus controlled light is emitted to the outside. In this manner, the vehicle lighting device 100 emits light distribution of the stop lamp function to the outside. The light distribution of the stop lamp function is bright (large in luminous flux, luminescence, luminous intensity, and intensity of illumination) in comparison with that of the tail lamp function described previously.

Then, the movable contact point of the switch is switched to a third fixed contact point. A current (a drive current) is then interrupted. As a result, one light emitting chip 40 or the four light emitting chips 41 to 44 turns or turn off the light. In this manner, the vehicle lighting device 100 turns off the light.

Here, the light that is radiated from the light emitting chips 40 to 44 (whose refractive index is about 2 to 3) is incident into the sealing member 180 (whose reflective index is about 1.5 to 1.6, for example), and the incident light is emitted from the sealing member 180 into the pneumatic air layer (whose refractive index is 1). Further, the emitted light is incident from the pneumatic air layer to the cover portion 12 and then the incident light is radiated from the cover portion 12 to the outside.

Then, a heat that is generated in the light emitting chips 40 to 44 of the light source portion 10; a resistor; a diode 2; and the conductors 51 to 56 is transmitted to a heat radiation member 8 via the board 3 and a thermally transmissible medium, and the transmitted heat is then radiated from the heat radiation member 8 to the outside. In addition, at least one of the four light emitting chips 41 to 44, each of which has a stop lamp function, is disconnected in wiring, a system on the vehicle light can detect wire disconnection of at least one of the four light emitting chips 41 o 44, each of which has a stop lamp function, due to a state change of a pull-down resistor.

(Description of Advantageous Effects)

The light source unit 1 and the vehicle lighting device 100, in the exemplary embodiment, are made of constituent elements and functions as described above. Hereinafter, advantageous effects of the light source unit and the vehicle lighting device will be described.

The light source unit 1 and the vehicle lighting device 100, in the exemplary embodiment, are capable of restraining the capacity (the range) of injecting (mold or molding) the sealing member 180 to be small in capacity by means of the bank member 18. In this manner, in the light source unit 1 and the vehicle lighting device 100, in the exemplary embodiment, it is sufficient if the capacity of the sealing member 180 be a capacity required to seal all of the five light emitting chips 40 to 44 and a part of wiring elements, i.e., a part of the conductors 51 to 56, all of the wire lines 61 to 65, and all of the bonding portions 610 to 650, and be small in comparison with that of a sealing member that is provided fully on the mounting surface 34 that serves as a package surface of the board 3 that serves as a mount member. As a result, in the light source unit 1 and the vehicle lighting device 100, in the exemplary embodiment, it is sufficient even if the capacity of the sealing member 180 could be small; and therefore, the occurrences of cracks with the sealing member 180 can be restrained less frequently in comparison with those with a sealing member with its large capacity, and the sealing performance of the sealing member 180 can be improved, and the yields of manufacture of the optical unit 1 is improved, accordingly. In addition, in the light source unit 1 and the vehicle lighting device 100, in the exemplary embodiment, it is sufficient that the capacity of the sealing member 180 be small; and therefore, manufacturing costs can be reduced, and a manufacturing time can be reduced while a curing time of the sealing member 180 is reduced.

In particular, in respect of the light source unit 1 and the vehicle lighting device 100, in the exemplary embodiment, the five light emitting chips 40 to 44 are intensively mounted on the mounting surface 34 of the board 3; and therefore, the light that is radiated from the five light emitting chips 40 to 44 that are intensively mounted can be effectively taken out, and it is sufficient that the capacity of the sealing member 180 could be small.

Moreover, in respect of the light source unit 1 and the vehicle lighting device 100, in the exemplary embodiment, the bank member 18 is mounted on the board 3; the sealing member 180 is injected into the bank member 18; and all of the five light emitting chips 40 to 44 and a part of the wiring elements, i.e., a part of the conductors 51 to 56 to be thereby able to package all of the wire lines 61 to 65, and all of the bonding portions 610 to 650 are sealed with the sealing members 180, whereby the board 3, the five light emitting chips 40 to 44, the control elements (a resistor and a diode), and the wiring elements (the conductors 51 to 56, the wire lines 61 to 65, and the bonding portions 610 to 650). As a result, the light source unit 1 and the vehicle lighting device 100, in the exemplary embodiment, is capable of taking out a number of, boards 3 (for example, 20), each of which is configured to package the five light emitting chips 40 to 44, the control elements (the resistor and the diode), and the wiring elements (the conductors 51 to 56, the wire lines 61 to 65, and the bonding portions 610 to 650); is capable of simplifying a manufacturing process; and is capable of reducing manufacturing costs in comparison with a case in which only one mount member can be taken out. Further, it is sufficient if a process for conveying the board to a sealing member curing process in order to cure the sealing member 180, i.e., a board conveying process could be performed only one time by taking out a number of boards 3 (for example, 20) in all, in comparison with a case in which only one board can be taken out, and a manufacturing process can be simplified, and manufacturing costs can be reduced, accordingly.

Furthermore, in respect of the light source unit 1 and the vehicle lighting device 100, in the exemplary embodiment, on the board 3, the range that is restrained by the bank member 18, i.e., all of the five light emitting chips 40 to 44 and a part of the wiring elements, i.e., a part of the conductors 51 to 56, all of the wire lines 61 to 65, and all of the bonding portions 610 to 650 are sealed with the sealing member 180, whereas the other range, i.e., almost all of the control elements (the resistor and the diode) and the conductors 51 to 56, each of which serves as a wiring element, are not sealed with the sealing member 180. Therefore, a heat from almost all of the control elements (the resistor and the diode) and the conductors 51 to 56, each of which serves as a wiring element, can be effectively radiated to the outside, and a heat radiation effect is improved.

In addition, in respect of the light source unit 1 and the vehicle lighting device 100, in the exemplary embodiment, the range of the inner circumferential face of the bank member 18 that surrounds the sealing member 180 is defined as the range in which the start point 185 at which the surface of the sealing member 180 warps upward with respect to the inner circumferential face of the bank member 18 by means of a surface tension is coincident with or is substantially coincident with the critical point 187 at which the light that is radiated from the given point 4 that is the shortest in distance from the inner circumferential face of the bank member 18 on the light emitting chip 41 is fully reflected on the interface 186 between the sealing member 180 and the pneumatic air layer. As a result, in respect of the light source unit 1 and the vehicle lighting device 100, in the exemplary embodiment, a loss of the light that is radiated from the five light emitting chips 40 to 44, the light being taken out via the sealing member 180, can be restrained to its required minimum, and it is sufficient that the capacity of the sealing member 180 could be at minimum.

Further, in respect of the light source unit 1 and the vehicle lighting device 100, in the exemplary embodiment, the bank member 18 can be reliably and precisely mounted on the board 3 by means of the positioning through hole 36 of the board 3 and the positioning protrusive portion 184 of the bank member 18, and the light from the five light emitting chips 40 to 44 that are taken out via the sealing member 180 can be controlled to be optically distributed (optically controlled) with high precision (with less distortion).

Furthermore, in respect of the light source unit 1 and the vehicle lighting device 100, in the exemplary embodiment, the portion 191 at which the sealing member 180 is injected into the bank member 18 is defined as a portion at which the wire lines 61 to 65 are not provided; and therefore, when the sealing member 180 is injected into the bank member 18, an injection stress of the sealing member 180 hardly acts on the wire lines 61 to 65. As a result, in respect of the light source unit 1 and the vehicle lighting device 100, in the exemplary embodiment, the electrical connecting portions (bonding portions 610 to 650) between: the wire lines 61 to 65; and the five light emitting chips 40 to 44 and the conductors 51 to 56, can be protected from a wire disconnection, and the wire lines 61 to 65; and the five light emitting chips 40 to 44 and the conductors 51 to 56, are reliably electrically connected to each other.

(Description of Examples Other than Exemplary Embodiment)

In the foregoing exemplary embodiment, five light emitting chips 40 to 44 are used. However, in the present invention, two to four light emitting chips or six or more light emitting chips may be used. The number or layout of light emitting chips used as a tail lamp function and the number or layout of light emitting chips used as a stop lamp function are not limited in particular.

In addition, in the foregoing exemplary embodiment, a tail/stop lamp is used. However, in the present invention, a combination lamp other than the tail/stop lamp or a lamp of a single function can be used. The lamps of the single function includes: a turn signal lamp; a backup lamp; a stop lamp; a tail lamp; a low beam head lamp (a head lamp for passing); a high beam head lamp (a head lamp for cruising); a fog lamp; a clearance lamp; a cornering lamp; a daytime running lamp or the like. That is, a light source unit made of a light emitting chip to which a low current is supplied and of which light emission quantity is small and a light emitting chip to which a mass current is supplied and of which light emission quantity is large functions in the same way as a light source unit of double filaments made of a subsidiary filament of which light emitting quantity is the smallest and a main filament of which light emission quantity is large.

Further, in the foregoing exemplary embodiment, switching of two lamps between a tail lamp and a stop lamp is available. However, in the present invention, switching of three or more lamps is also available.

Furthermore, in the foregoing exemplary embodiment, five light emitting chips 40 to 44 are disposed in one line. However, in the present invention, light emitting chips may be disposed in a circular shape on a corner of a rectangle. For example, the light emitting chips may be disposed at four corners of a square or at three corners of a triangle.

Yet furthermore, in the foregoing exemplary embodiment, a connector portion 13 is integrally provided at a socket portion 11. However, in the present invention, the connector portion 13 may not be integrally provided at the socket portion 11. In this case, a connector on a light source side is provided independently of the socket portion 11, and the connector on the light source side is electrically connected to a power feeding member (refer to power feeding members 91 to 93 of the exemplary embodiment) of a light source unit 1 via a harness. A connector 14 on a power source is mounted on the connector on the light source side, whereby electric power is supplied to a light source portion 10, and the connector 14 on the power source side is removed from the connector on the light source side, whereby electric power supply to the light source portion 10 is interrupted.

Moreover, in the foregoing exemplary embodiment, a first conductor 51 for feeding power a light emitting chip 40 of a tail lamp function is mounted on a lower mounting surface 34 of mounting surface 34 of a board 3 that is divided into two upper and lower sides by means of a line segment L connecting light emitting chips 41, 42 and 43, 44 of a stop lamp function. However, in the present invention, the first conductor 51 may be mounted on an upper mounting surface 34 of the mounting surface 34 of the board 3 that is divided into two upper and lower sides by means of the line segment L. In addition, in a case where light emitting chips are arranged in a longitudinal direction, these chips may be mounted on a left side mounting surface or on a right side mounting surface that is divided into two left and right sides. Further, in a case where light emitting chips are arranged in an oblique direction, these chips may be mounted on one mounting surface or the other mounting surface of a board that is obliquely divided into two sections.

Furthermore, in the foregoing exemplary embodiment, the bank member 18 is formed in a rectangular shape as it is seen from a plan view. However, in the present invention, the shape of the bank member and the range or the like, for restraining the capacity of the sealing member, are not limited in particular.

Still furthermore, in the foregoing exemplary embodiment, the light emitting chips 40 to 44; the conductors 51 to 56, each of which serves as a wiring element; the wire lines 61 to 65; the bonding portions 610 to 650; a resistor; a diode; the bank member 18; and the sealing members 180, are mounted on the mounting surface 34 of the board 3 that serves as a mount member. However, in the present invention, the light emitting chips 40 to 44; the conductors 51 to 56, each of which serves as a wiring element; the wire lines 61 to 65; the bonding portions 610 to 650; a resistor; a diode; the bank member 18; and the sealing members 180, may be mounted via an insulation layer on a mounting surface (an abutment surface 80) of the heat radiation member 8.

Yet furthermore, in the foregoing exemplary embodiment, light distribution is controlled by means of the cover portion 12 and the lamp lens 102. However, in the present invention, light distribution may be controlled by means of either one of the cover portion 12 and the lamp lens 102, or alternatively, an optical member may be provided for traveling the light that is radiated from a light emitting chip in a predetermined direction. This optical member is a reflection surface that is provided at the bank member itself, the reflection surface being configured to reflect the light that is radiated from a side face of a light emitting chip in a predetermined direction. Alternatively, the optical member is also a lens that is provided at an edge of an opening portion of the bank member so as to cover the opening portion of the bank member that is formed in opposite to a front face of a light emitting chip, the lens being configured to emit the light that is radiated from the front face of the light emitting chip in a predetermined direction.

Yet moreover, in the foregoing exemplary embodiment, a socket portion 11 having an insulation member 7, a radiation member 8, and three power feeding member 91, 92, and 93 are used as a light source unit 1. However, in the present invention, only the heat radiation member 8 may be used as a light source unit without using the insulation member 7 and the three power feeding members 91, 92, and 93. In this case, the light source unit is provided with: a heat radiation member; a board or an insulation layer that serves as an insulation member; and a light source portion. On the other hand, a vehicle lighting device is provided with a power feeding member to be electrically connected to a power feeding electrode (not shown) of a light source portion.

Furthermore, in the foregoing exemplary embodiment, the positioning through hole 36 is provided in the board 3, whereas the positioning protrusive portion 184 is provided on the bank member 18. However, in the present invention, it may be that a positioning protrusive portion is provided on the board 3, whereas a positioning recessed portion is provided on the bank member 18. Alternatively, it may also be that a positioning recessed portion and a positioning protrusive portion are respectively provided on the board 3, whereas a positioning protrusive portion and a positioning recessed portion are respectively provided on the bank member 18.

What is claimed is:

1. A light source unit of a semiconductor-type light source of a vehicle lighting device, comprising:
    a mount member;
    a plurality of light emitting chips of semiconductor-type light sources that are intensively mounted on the mount member, configured to radiate light from faces other than a surface on which the light emitting chips are mounted on the mount member;
    a control element that is mounted on the mount member, configured to control light emission of the light emitting chips;
    a wiring element that is mounted on the mount member, configured to supply power to the light emitting chips via the control element;
    a bank member that is mounted on the mount member, surrounding all of the plurality of the light emitting chips and a part of a wiring element, and having a flat inner circumferential face extending from a surface of the mount member, in a direction perpendicular to the surface of the mount member, to a top of the bank member; and
    an optically transmissible sealing member that is injected into the bank member, sealing all of the plurality of the light emitting chips and a part of the wiring element,
    wherein, the bank member and the mount member are formed as separate members,
    the mount member is provided with a positioning through hole extending entirely through the mount member,
    the bank member is provided with a positioning protrusive portion formed of the same material as the bank member in association with the positioning through hole, and
    the positioning through hole and the associated positioning protrusive portion are engaged with each other, whereby the bank member is positioned with respect to the mount member, and
    wherein the positioning through hole is provided at such a position that in a case where the positioning through hole and the associated positioning protrusive portion are engaged with each other, a surface portion of the sealing member from a critical point at which light that is radiated from a given point that is the shortest from the inner circumferential face of the bank member among the light emitting chips is fully reflected on an interface between the sealing member and a pneumatic air layer, to the inner circumferential surface of the bank member is at least a surface which warps upwardly toward the inner circumferential surface of the bank member because of surface tension.

2. The light source unit of the semiconductor-type light source of the vehicle lighting device, according to claim 1,
    wherein a part of the wiring element that is surrounded by the bank member, and is sealed with the sealing member, is comprised of a conductor and a wire line for electrically connecting the conductor and the light emitting chips to each other, and
    a portion at which the sealing member is to be injected into the bank member is a portion at which the wire line is not provided.

3. A vehicle lighting device using a semiconductor-type light source as a light source, comprising:
    a lamp housing and a lamp lens that partition a lamp room; and
    a light source unit of a semiconductor-type light source of the vehicle lighting device according to claim 1 that is disposed in the lamp room.

4. The light source unit of the semiconductor-type light source of the vehicle lighting device, according to claim 1, wherein
    the bank member and the mount member are made of different materials,
    the bank member is comprised of an insulation member, and
    the mount member is comprised of a board including a conductive member.

* * * * *